(12) United States Patent
Kawase

(10) Patent No.: US 6,646,915 B2
(45) Date of Patent: Nov. 11, 2003

(54) SEMICONDUCTOR DEVICE

(75) Inventor: Tatsuya Kawase, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/176,656

(22) Filed: Jun. 24, 2002

(65) Prior Publication Data
US 2003/0095433 A1 May 22, 2003

(30) Foreign Application Priority Data
Nov. 21, 2001 (JP) ........................................ 2001-356355

(51) Int. Cl.$^7$ .............................................. G11C 16/00
(52) U.S. Cl. ........................... 365/185.08; 365/185.04; 365/185.09
(58) Field of Search ..................... 365/185.08, 185.04, 365/185.33, 185.09, 236

(56) References Cited

U.S. PATENT DOCUMENTS

| | | | | |
|---|---|---|---|---|
| 5,909,391 A | * | 6/1999 | Loibl | 365/185.08 |
| 6,198,663 B1 | * | 3/2001 | Takizawa | 365/185.33 |
| 6,462,992 B2 | * | 10/2002 | Harrari et al. | 365/185.33 |

FOREIGN PATENT DOCUMENTS

JP  3-288948  12/1991

* cited by examiner

Primary Examiner—Tan T. Nguyen
(74) Attorney, Agent, or Firm—McDermott, Will & Emery

(57) ABSTRACT

A semiconductor device comprises a nonvolatile memory (A) for storing information on a frequency of operation; a volatile memory (B) in which the information on the frequency of operation is rewritten; and a control device for transferring the information on the frequency of operation stored in the memory (A) to the memory (B), rewriting the transferred information in the memory (B), and returning the rewritten information to the memory (A).

6 Claims, 1 Drawing Sheet

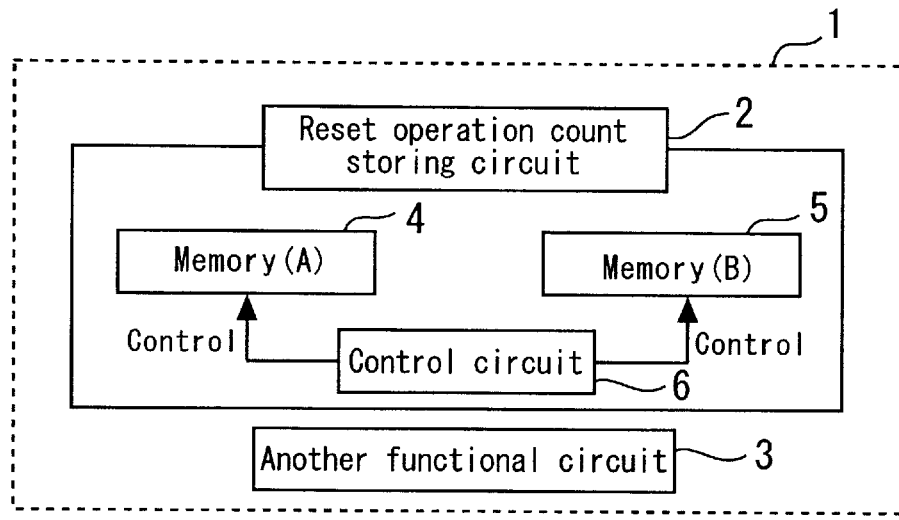
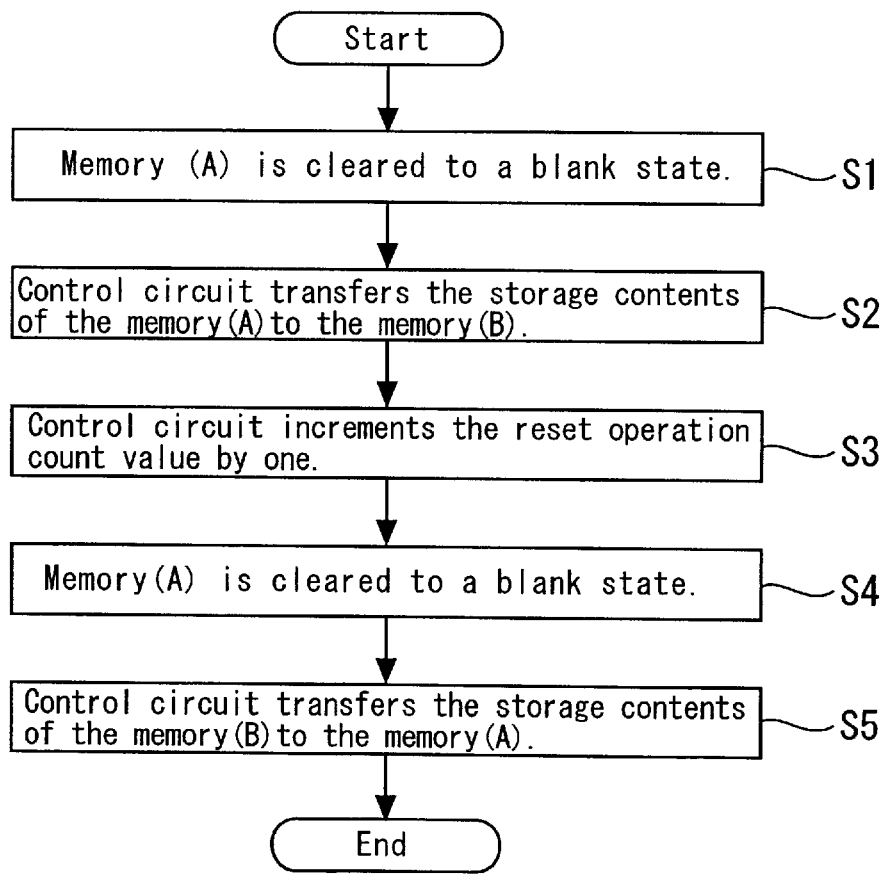

SEMICONDUCTOR DEVICE

BACKGROUND OF THE INVENTION

1. Field of the Invention

The present invention relates to a semiconductor device, and more particularly to a semiconductor device for assuring a product based on the frequency of operation of the semiconductor device.

2. Background Art

Recently, semiconductor devices have been used for various applications such as consumer products and automobiles, the latter of which require high reliability, necessitating product assurances tailored for each application.

Conventionally, the assurance of the actual total operation time of a semiconductor device included in a product assurance is estimated based on the total time of use of a finished product, which in turn is estimated from the total number of uses and the frequency of use of the product, which are predicted for each application, and the maximum allowable number of uses of the semiconductor device.

However, the actual total operation time and the actual frequency of operation of a semiconductor device considerably vary depending on its use conditions and applications. As described above, the conventional method determines the total operation time of a semiconductor device only from the total time of use of the finished product. Therefore, if the semiconductor device is used such that its frequency of use is high, the performance of the semiconductor device deteriorates before a predetermined total time of use of the product elapses, which has caused a problem. If the semiconductor device is used such that its frequency of use is low, on the other hand, the semiconductor device is discarded after the predetermined total time of use of the product has elapsed even though the semiconductor device is still satisfying a desired performance. This means that a semiconductor device whose actual total operation time has not yet exceeded a predetermined allowable maximum value is wastefully discarded.

SUMMARY OF THE INVENTION

In view of the foregoing, the present invention has been made, and it is an object of the present invention to provide a technique for accurately detecting the actual total operation time of a semiconductor device based on its frequency of actual operation.

According to one aspect of the present invention, a semiconductor device comprises a nonvolatile memory, a volatile memory, and control means. The nonvolatile memory is for storing information on a frequency of operation. The information on the frequency of operation is rewritten in the volatile memory. The control means is for transferring the information on the frequency of operation stored in the nonvolatile memory to the volatile memory. The control means rewrites the information on the frequency of operation in the volatile memory. The control means returns the information on the frequency of operation to the nonvolatile memory.

By transferring information on a frequency of operation to a volatile memory, it is possible to rewrite the information on the frequency of operation in the volatile memory. Furthermore, by returning the rewritten information to the nonvolatile memory, the information on the frequency of operation can be held even after the power is turned off. With this arrangement, since it is possible to constantly check the frequency of use of the semiconductor device by reading out the storage contents of the nonvolatile memory, the user can use the semiconductor device while checking its frequency of use. The manufacturer, on the other hand, can design the semiconductor device so that the semiconductor device performs a predetermined operation according to its frequency of operation.

Other and further objects, features and advantages of the invention will appear more fully from the following description.

BRIEF DESCRIPTION OF THE DRAWINGS

FIG. 1 is a schematic diagram showing the configuration of a semiconductor device according to an embodiment of the present invention.

FIG. 2 is a flowchart showing a processing procedure for storing the number of reset operations in the semiconductor device shown in FIG. 1.

DETAILED DESCRIPTION OF THE PREFERRED EMBODIMENTS

FIG. 1 is a schematic diagram showing the configuration of a semiconductor device 1 according to an embodiment of the present invention. As shown in FIG. 1, the semiconductor device 1 is made up of a single chip having thereon a reset operation count storing circuit 2, another functional circuit 3, a memory (A) 4, a memory (B) 5, and a control circuit 6. It should be noted that the memory (A) 4, the memory (B) 5, and the control circuit 6 are included in the reset operation count storing circuit 2.

The memory (A) 4 is a nonvolatile rewritable memory for storing the number of reset operations, while the memory (B) 5 is a rewritable memory such as a RAM. The control circuit 6 has a function to control the memory (A) 4 and the memory (B) 5, and operates in synchronization with an internal clock. Specifically, the control circuit 6 performs processing such as erasing/writing, data transfer, and data increment.

As information on the frequency of operation of the semiconductor device 1, in the present embodiment the number of reset operations (reset operation count) is stored. The number of reset operations is stored in the memory (A) 4.

Since the memory (A) 4 is a nonvolatile memory, data written in the memory is held even after the power is turned off. The memory (B) 5, on the other hand, is a volatile memory such as a RAM, and therefore data in the memory (B) 5 is freely rewritten as long as the power is on.

The present embodiment utilizes such characteristics of the memory (A) 4 and the memory (B) 5 so that data is stored in the memory (A) 4 and rewritten in the memory (B) 5 separately. More specifically, in reset operation, data written in the memory (A) 4 is transferred to the memory (B) 5 which then rewrites the data. The rewritten data is returned to the memory (A) 4. Thus, since data is rewritten in the volatile memory (B) 5 in the reset operation, it is possible to surely rewrite data to be stored in the nonvolatile memory (A) 4.

FIG. 2 is a flowchart showing a processing procedure for storing the number of reset operations in the semiconductor device 1 shown in FIG. 1. At the time of shipping, the memory (A) 4 is cleared to a blank state as indicated at step S1.

When the semiconductor device 1 is reset through its use by a user at the next step S2, the control circuit 6 transfers the storage contents of the memory (A) 4 to the memory (B) 5. At step S3, the control circuit 6 increments the reset operation count value (the number of reset operations) transferred to the memory (B) 5 by one. At the subsequent step S4, the control circuit 6 erases the contents of the memory (A) 4 to clear the memory to a blank state.

It should be noted that the order of step S3 and step S4 may be reversed. That is, it is possible to execute step S2, step S4 and step S3 in that order. At step S5, the control circuit 6 writes the updated reset operation count value held in the memory (B) 5 into the memory (A) 4.

As described above, since the semiconductor device 1 having the configuration shown in FIG. 1 automatically performs steps 2 through 5, the reset operation count value stored in the memory (A) 4 is automatically incremented accordingly. Then, the storage contents of the memory (A) 4 can be read out to check the number of reset operations of the semiconductor device 1 when necessary.

According to the present embodiment described above, since it is possible to constantly check the frequency of use of the semiconductor device 1 based on its reset operation count, the user can use the semiconductor device 1 while checking its frequency of use.

The manufacturer, on the other hand, can design the semiconductor device 1 for, e.g., applications that require high reliability taking into account its frequency of operation in such a way that the semiconductor device 1 automatically transmits an alarm before it enters a wear-out failure period. Furthermore, when evaluating a product returned from a customer, the manufacturer can accurately estimate the total time of use of the semiconductor device based on the uses of the customer and the number of the reset operations.

Incidentally, in the above description, the number of reset operations is stored as information on the frequency of operation. However, the present invention is not limited to this specific arrangement. It is possible to store other data concerning the frequency of operation, such as the number of power-on operations or the time when the semiconductor device 1 has been actually operated.

Further, even though the above embodiment uses a volatile memory as the memory (B) 5, a rewritable nonvolatile memory may be used instead.

Configured as described above, the present invention has the following effects.

By transferring information on a frequency of operation to a volatile memory, it is possible to rewrite the information on the frequency of operation in the volatile memory. Furthermore, by returning the rewritten information to the nonvolatile memory, the information on the frequency of operation can be held even after the power is turned off. With this arrangement, since it is possible to constantly check the frequency of use of the semiconductor device by reading out the storage contents of the nonvolatile memory, the user can use the semiconductor device while checking its frequency of use. The manufacturer, on the other hand, can design the semiconductor device so that the semiconductor device performs a predetermined operation according to its frequency of operation.

By using information on the number of reset operations as information on a frequency of operation, it is possible to rewrite the information on the frequency of operation based on the number of reset operations of the semiconductor device.

By using information on the number of power-on operations as information on a frequency of operation, it is possible to rewrite the information on the frequency of operation based on the number of power-on operations of the semiconductor device.

By transferring information on a frequency of operation to a volatile memory and erasing the storage contents of a nonvolatile memory, it is possible to surely store information rewritten in the volatile memory into the nonvolatile memory.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-356355, filed on Nov. 21, 2001 including specification, claims, drawings and summary, on which the Convention priority of the present application is based, are incorporated herein by reference in its entirety.

What is claimed is:

1. A semiconductor device comprising:

a nonvolatile memory for storing information on a frequency of operation;

a volatile memory in which said information on said frequency of operation is rewritten; and control means for transferring said information on said frequency of operation stored in said nonvolatile memory to said volatile memory, rewriting said information on said frequency of operation in said volatile memory, and returning said information on said frequency of operation to said nonvolatile memory.

2. The semiconductor device according to claim 1, wherein said information on said frequency of operation is information on the number of reset operations.

3. The semiconductor device according to claim 2, wherein said control means transfers said information on said frequency of operation stored in said nonvolatile memory to said volatile memory and then erases storage contents of said nonvolatile memory.

4. The semiconductor device according to claim 1, wherein said information on said frequency of operation is information on the number of power-on operations.

5. The semiconductor device according to claim 4, wherein said control means transfers said information on said frequency of operation stored in said nonvolatile memory to said volatile memory and then erases storage contents of said nonvolatile memory.

6. The semiconductor device according to claim 1, wherein said control means transfers said information on said frequency of operation stored in said nonvolatile memory to said volatile memory and then erases storage contents of said nonvolatile memory.

* * * * *